United States Patent [19]
Ehara

[11] Patent Number: 5,577,129
[45] Date of Patent: Nov. 19, 1996

[54] AMPLIFIER CIRCUIT FOR ELECTRET CONDENSER MICROPHONE

[75] Inventor: Tatsuji Ehara, Tokyo, Japan

[73] Assignee: Nec Corporation, Tokyo, Japan

[21] Appl. No.: 372,884

[22] Filed: Jan. 13, 1995

Related U.S. Application Data

[63] Continuation of Ser. No. 989,824, Dec. 14, 1992.

[30] Foreign Application Priority Data

Dec. 12, 1991 [JP] Japan ................................ 3-350656

[51] Int. Cl.⁶ ........................................................ H04R 3/00
[52] U.S. Cl. ......................... 381/113; 381/120; 381/122; 379/395
[58] Field of Search .................................. 381/120, 122, 381/113, 174; 379/395

[56] References Cited

U.S. PATENT DOCUMENTS

| | | | |
|---|---|---|---|
| 3,789,155 | 1/1974 | Fensom | 379/395 |
| 3,974,344 | 8/1976 | Mersich | 379/395 |
| 4,281,221 | 7/1981 | Delbello | 381/174 |
| 4,303,805 | 12/1981 | Synek et al. | 379/395 |
| 4,314,107 | 2/1982 | Hestad et al. | 379/395 |
| 4,326,106 | 4/1982 | Minner et al. | 379/395 |
| 4,518,829 | 5/1985 | Boeckmann | 381/113 |
| 4,536,888 | 8/1985 | Wilson | 379/395 |
| 4,541,112 | 9/1985 | Kern | 381/113 |
| 4,640,993 | 2/1987 | Whittaker | 379/395 |
| 4,672,663 | 6/1987 | Tomasi et al. | |
| 4,757,545 | 7/1988 | Rosander | 381/113 |
| 4,922,547 | 5/1990 | Murata | |
| 5,036,536 | 7/1991 | Hanon et al. | |

FOREIGN PATENT DOCUMENTS

| | | |
|---|---|---|
| 0305301 | 3/1989 | European Pat. Off. . |
| 2651120 | 1/1990 | France . |
| 242708 | 2/1987 | Germany . |
| 1441624 | 7/1976 | United Kingdom ................ 381/113 |

OTHER PUBLICATIONS

Tremaine, Audio Cyclopedia, 1980, pp. 549 & 607.
Langford–Smith (ed.), Radiotron Designer's Handbook, 1968, pp. 535–539.
Tremaine, Audio Cyclopedia, 1980, pp. 549–607.

Primary Examiner—Forester W. Isen
Attorney, Agent, or Firm—Sughrue, Mion, Zinn, Macpeak & Seas

[57] ABSTRACT

An amplifier circuit for an electret condenser microphone includes an operational amplifier, an operational amplifier, a bias circuit, and a power supply circuit. The operational amplifier has an inverting input terminal for receiving an output of a two-wire lead electret condenser microphone and a noninverting input terminal for receiving a bias voltage. The bias circuit divides a power supply voltage to generate the bias voltage. The power supply circuit applies the power supply voltage to the electret condenser microphone through the bias circuit and a first resistor.

5 Claims, 3 Drawing Sheets

AMPLIFIER CIRCUIT FOR ELECTRET CONDENSER MICROPHONE

This is a continuation of application No. 07/989,824 filed Dec. 14, 1992.

BACKGROUND OF THE INVENTION

The present invention relates to an amplifier circuit for a two-wire lead ECM (Electret Condenser Microphone) and, more particularly, to an amplifier circuit using an operational amplifier.

A conventional amplifier circuit of this type using a single power supply is shown in FIG. 3. A bias voltage applied to a noninverting input terminal 10 of an operational amplifier 2 is generated by a bias circuit 8 constituted by voltage dividing resistors 4 and 5 and a capacitor 6 for reducing power source noise. Since a two-wire lead ECM 3 which applies its output to an inverting input terminal 14 of the operational amplifier 2 receives a power supply voltage and a signal through a common line, a power supply voltage is applied to the ECM 3 by a power supply circuit 9 constituted by resistors 11 and 12 and a capacitor 13. The resistor 12 serves as the load resistor of the power supply circuit 9, and the capacitor 13 reduces noise included in the power supply to prevent the S/N ratio of the ECM 3 from being decreased.

In addition, a capacitor 20 is used for cutting a DC component, and resistors 21 and 22 are used for setting the gain of the operational amplifier 2. Reference numeral 1 denotes an output terminal.

In the above conventional amplifier circuit, the bias circuit 8 for applying a power supply voltage to the noninverting input terminal of the operational amplifier 2 and the power supply circuit 9 for applying a voltage to the ECM 3 are required, and have independent circuit arrangements, respectively. For this reason, in portable equipment such as a portable telephone apparatus which is expected to be compact and lightweight, the number of parts is decreased. In the above conventional arrangement, however, the number of parts of the power supply system circuits 8 and 9 is increased. This is a serious limitation to a decrease in size of the portable equipment.

SUMMARY OF THE INVENTION

It is an object of the present invention to provide an amplifier circuit for an electret condenser microphone, in which the size of a power supply system circuit is decreased to reduce the number of parts of the power supply system circuit.

It is another object of the present invention to provide an amplifier circuit for an electret condenser microphone, which does not restrict decreases in size and weight of portable equipment.

In order to achieve the above objects, according to the present invention, there is provided an amplifier circuit for an electret condenser microphone, comprising an operational amplifier having an inverting input terminal for receiving an output from a two-wire lead electret condenser microphone and a noninverting input terminal for receiving a bias voltage, a bias circuit for dividing a power supply voltage to generate the bias voltage, and a power supply circuit for applying the power supply voltage to the electret condenser microphone through the bias circuit and a first resistor.

DESCRIPTION OF THE PREFERRED EMBODIMENT

Figure 1:
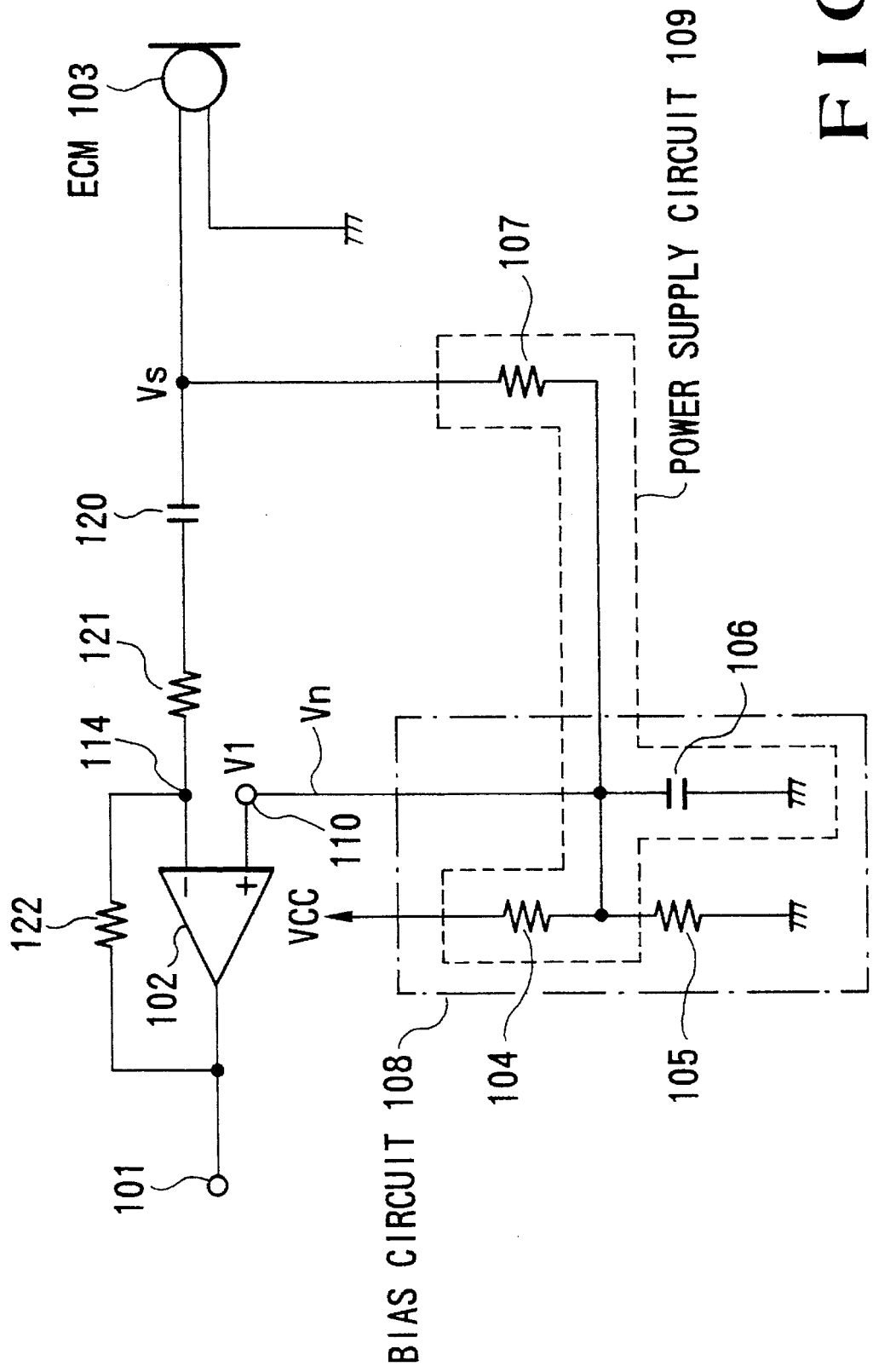
FIG. 1 is a circuit diagram showing an amplifier circuit for an ECM according to an embodiment of the present invention.

The present invention will be described below with reference to the accompanying drawings. FIG. 1 shows an amplifier circuit for an electret condenser microphone according to the present invention, and shows an amplifier circuit, for a two-wire lead ECM, operated by a single power supply. A bias voltage applied to a noninverting input terminal 110 of an operational amplifier 102 is generated by a bias circuit 108 constituted by voltage dividing resistors 104 and 105 and a capacitor 106 for reducing power source noise. Since a bias voltage V1 input to the noninverting input terminal 110 of the operational amplifier 102 is generally selected such that the operational amplifier obtains a maximum output amplitude, the resistances of the resistors 104 and 105 are set to satisfy a condition $V1=Vcc/2$.

In order to supply a voltage to an ECM 103 for supplying its output to an inverting input terminal 114 of the operational amplifier 102, the output terminal of the bias circuit 108, i.e., the noninverting input terminal 110 of the operational amplifier 102 is connected to the ECM 103 via a resistor 107, and the resistor 107, the resistor 104, and the capacitor 106 constitute a power supply circuit 109. In this case, the resistor 107 serves as the load resistor of the ECM 103, and the capacitor 106 reduces noise included in a power supply voltage to the ECM 103 to prevent the S/N ratio of the ECM 3 from being decreased.

Note that a capacitor 120 is a capacitor for cutting a DC component, and resistors 121 and 122 are used for setting the gain of the operational amplifier 102. Reference numeral 101 denotes an output terminal.

With the above arrangement, the power supply circuit 109 for supplying a power supply voltage to the ECM 103 can be arranged by using the resistor 104 and the capacitor 106 in the bias circuit 108 and additionally arranging the resistor 107. For this reason, some parts of the bias circuit 108 can be used as the parts of the power supply circuit 109, and the number of parts of the bias circuit 108 is decreased by the number of commonly used parts. Therefore, a compact and lightweight portable equipment can be obtained.

In addition, with the above arrangement, power supply noise can be canceled.

The present invention will be described below using a circuit in which the resistances of the resistors 104, 105, 107, 121, and 122 are set to be 4.7 kΩ, 6.8 kΩ, 2.2 kΩ, 22 kΩ, and 270 kΩ, respectively, and the capacitances of the capacitors 106 and 120 are set to be 2.2 μF and 0.01 μF, respectively. When a power supply voltage includes noise, for example, the voltage of noise generated by the noninverting input terminal 110 of the operational amplifier 102 and the voltage of a signal generated by the ECM 103 are represented by Vn and Vs, respectively. In this case, when these voltages are amplified by the circuit, a voltage output to the output terminal 101 of the operational amplifier 102 has a signal component of 12.3 Vs and a noise component of 2.4 Vn.

That is, even when a signal-to-noise ratio (S/N ratio) on the input side is Vs/Vn, an S/N ratio on the output side is 12.3 Vs/2.4 Vn. Therefore, the S/N ratio is increased by 5.125 times.

Figure 2:
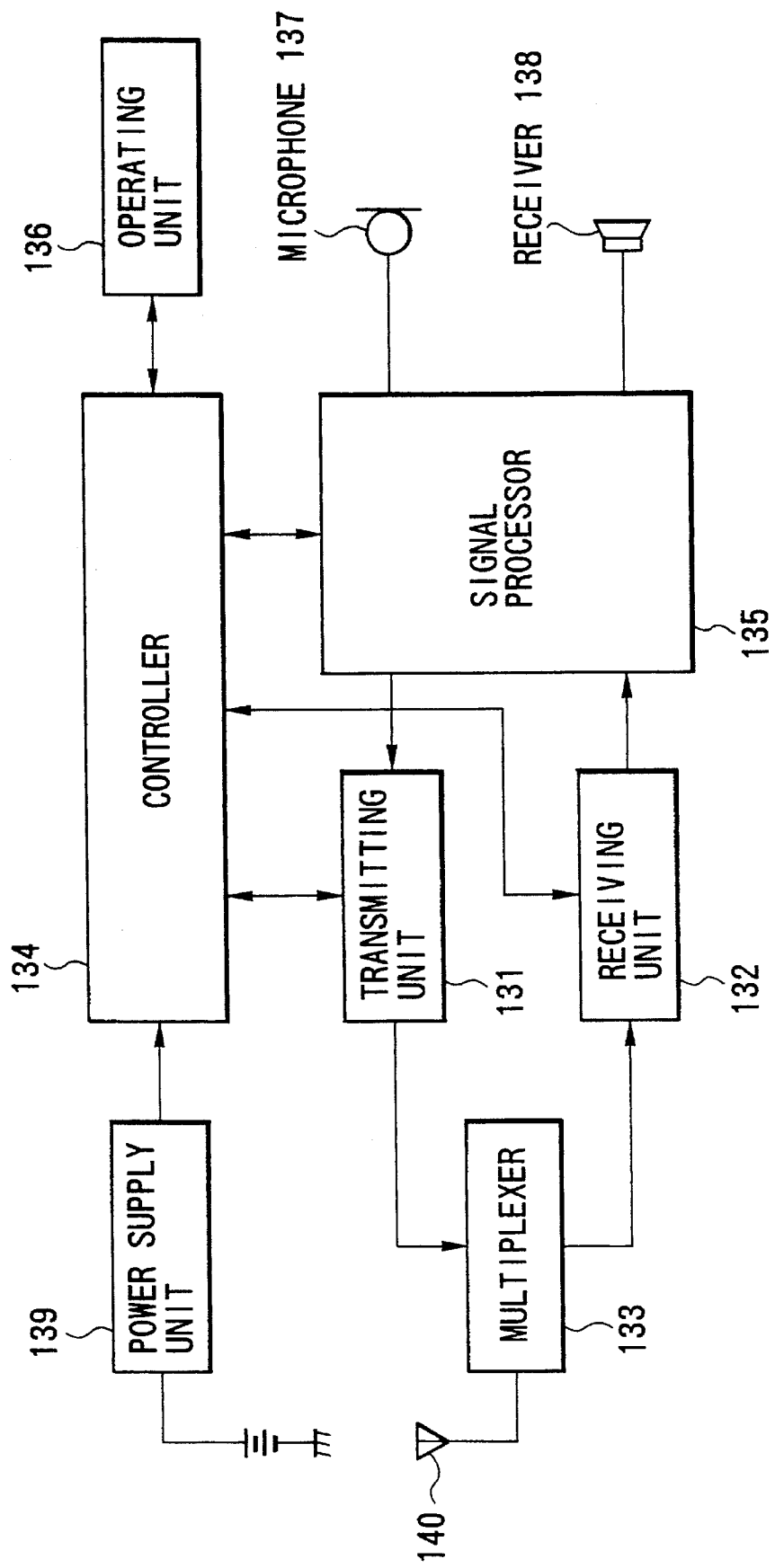
FIG. 2 is a block diagram showing a portable telephone apparatus in which the amplifier circuit for the ECM of the present invention is used.
Figure 3:
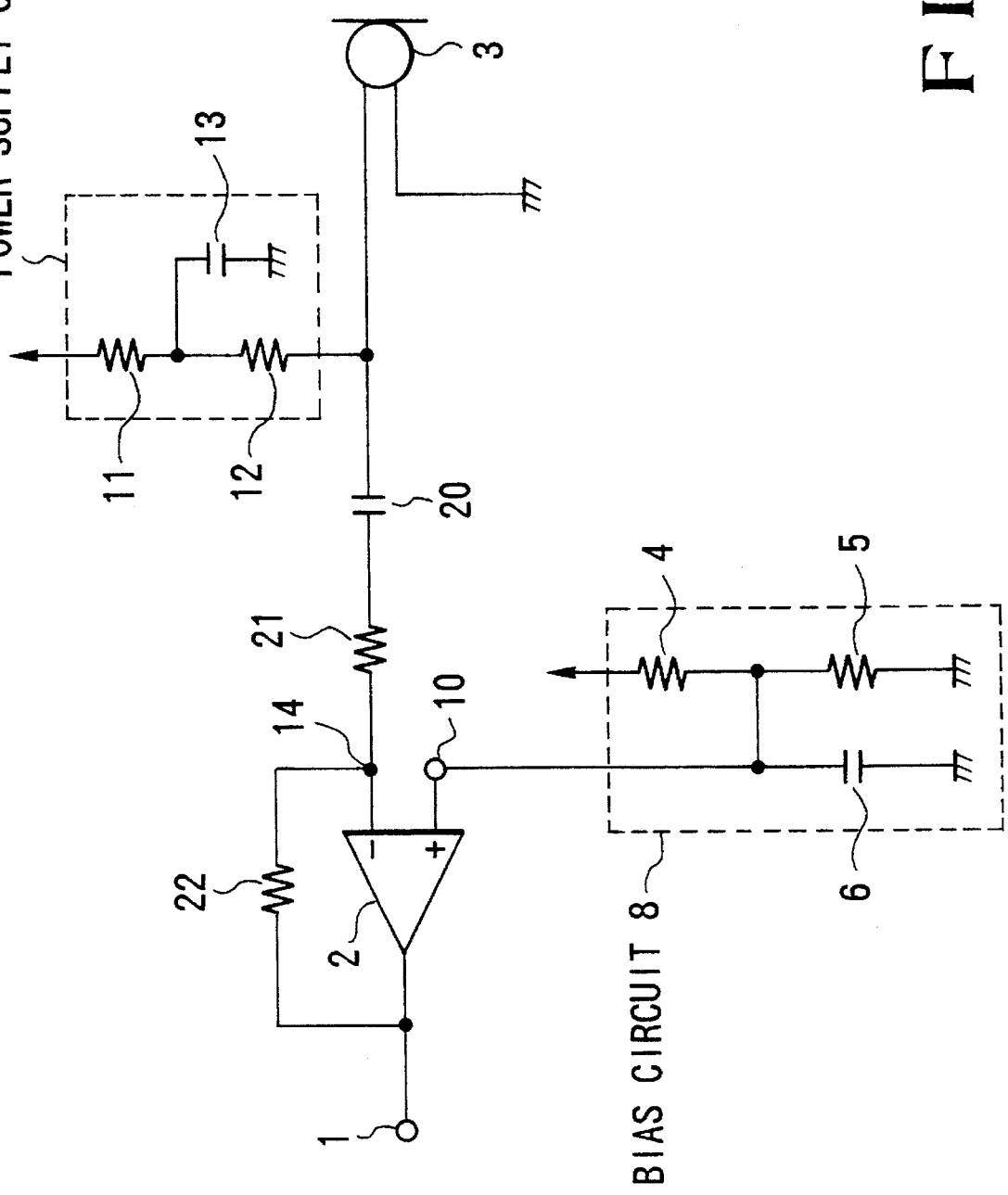
FIG. 3 is a circuit diagram showing a conventional amplifier circuit for an ECM.

FIG. 2 shows a portable telephone apparatus of a mobile telephone system in which the amplifier circuit for the ECM according to the present invention is used. The portable telephone apparatus in FIG. 2 comprises a transmitting unit 131, a receiving unit 132, a multiplexer 133, a controller 134, a signal processor 135, an operating unit 136, and a microphone 137, a receiver 138, a power supply unit 139, and an antenna 140.

A speech input from the microphone 137 passes through a bandpass filter, a compressor, and a preemphasis circuit (which are not shown) by the signal processor 135, is FM-modulated in the transmitting unit 131, and is transmitted from the antenna 140 through the multiplexer 133. In addition, a received wave passes from the antenna 140 through the multiplexer 133 and is FM-demodulated in the receiving unit 132. The wave passes through a deemphasis circuit, a bandpass filter, and an expander circuit (which are not shown) by the signal processor 135 and is output as speech from the receiver 138.

The controller 134 designates the channel of the transmitting unit 131, ON/OFF-controls a carrier, designates the channel of the receiving unit 132, controls to monitor received signal strength, designates a speech path of the signal processor 135, processes data with a base station, processes data with the operating unit 136, and controls the power supply unit 139.

The amplifier circuit for the ECM according to the present invention is related to an amplifier circuit incorporated in the microphone 137.

As has been described above, according to the present invention, a resistor is connected between an ECM and the connection point between voltage dividing resistors of a bias circuit, and a power supply voltage is supplied to the ECM through these resistors. For this reason, since some parts of the bias circuit can be used as the parts of a power supply circuit for the ECM, the number of parts of the power supply circuit, and the size of an amplifier circuit can be decreased. As a result, compact and lightweight portable equipment can be advantageously obtained. In addition, the amplifier circuit withstands power supply noise and variations in power supply voltage.

What is claimed is:

1. An amplifier circuit for an electret condenser microphone, comprising:

an operational amplifier having an inverting input terminal for receiving an output of a two-wire lead electret condenser microphone and a noninverting input terminal for receiving a bias voltage;

a bias circuit for dividing a power supply voltage from a power supply to generate the bias voltage; and a power supply circuit for applying the power supply voltage to said electret condenser microphone through said bias circuit and a first resistor, wherein said bias circuit comprises voltage dividing second and third resistors connected in series between said power supply and ground, and a capacitor connected between ground and a connection point between said second and third resistors;

said power supply circuit comprises said second resistor connected to said power supply, said capacitor, and said first resistor connected between said electret condenser microphone and said connection point between said second and third resistors; and the amplifier circuit has the following characteristics:
   the first resistor has a value of 2.2 kΩ
   the second resistor has a value of 4.7 kΩ,
   the third resistor has a value of 6.8 kΩ, and
   the capacitor has a value of 2.2 µF.

2. A circuit according to claim 1, wherein an output terminal for the bias voltage of said bias circuit is connected to said electret condenser microphone through said first resistor.

3. A circuit as claimed in claim 1, wherein said second and third resistors are directly connected in series to each other, said second resistor being directly connected to said power supply and said third resistor being directly connected to ground;

said capacitor is directly connected to said connection point between said second and third resistors; and said second resistor and said capacitor are directly connected to said first resistor which is directly connected to said electret condenser microphone.

4. An amplifier circuit for an electret condenser microphone, comprising:

a two-wire lead electret condenser microphone;

an operational amplifier having an inverting input terminal for receiving an output signal from an output terminal of said electret condenser microphone and a noninverting input terminal for receiving a bias voltage;

a bias circuit, for dividing a power supply voltage to generate the bias voltage, comprising first and second resistors connected in series between a power supply and ground, and a capacitor connected in parallel to said second resistor, a connection point between said first and second resistors being connected to said noninverting input terminal of said operational amplifier; and a third resistor for applying the bias voltage generated by said bias circuit to said electret condenser microphone, wherein said output terminal of said electret condenser microphone is connected to said noninverting input terminal of said operational amplifier via said third resistor; and the amplifier circuit has the following characteristics:
   the first resistor has a value of 4.7 kΩ,
   the second resistor has a value of 6.8 kΩ,
   the third resistor has a value of 2.2 kΩ, and
   the capacitor has a value of 2.2 µF.

5. A circuit as claimed in claim 4, wherein said first and second resistors are directly connected to each other, said first resistor being directly connected to said power supply and said second resistor being directly connected to ground;

said capacitor is directly connected to said second resistor;

said connection point between said first and second resistors is directly connected to said noninverting input terminal of said operational amplifier; and said resistor for applying the bias voltage is directly connected to said connection point between said first and second resistors and directly connected to said electret condenser microphone.

* * * * *